(12) United States Patent
Chen et al.

(10) Patent No.: US 6,914,264 B2
(45) Date of Patent: Jul. 5, 2005

(54) STRUCTURE AND MANUFACTURING METHOD FOR GAN LIGHT EMITTING DIODES

(75) Inventors: Lung-Chien Chen, Hsin-Chuang (TW); Wen-How Lan, Taoyuan (TW); Fen-Ren Chien, Yung-Ho (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 182 days.

(21) Appl. No.: 10/283,886

(22) Filed: Oct. 29, 2002

(65) Prior Publication Data

US 2004/0079948 A1 Apr. 29, 2004

(51) Int. Cl.$^7$ .................... H01L 29/201; H01L 29/24
(52) U.S. Cl. .................................. 257/96; 257/103
(58) Field of Search ........................... 257/9, 12, 13, 257/1, 22, 79, 94, 96, 99, 101, 103, 615, 14; 438/22, 46, 47

(56) References Cited

U.S. PATENT DOCUMENTS

| | | | | |
|---|---|---|---|---|
| 5,789,265 A | * | 8/1998 | Nitta et al. ................. | 438/22 |
| 6,078,064 A | * | 6/2000 | Ming-Jiunn et al. ........ | 257/103 |
| 6,515,306 B2 | * | 2/2003 | Kuo et al. .................... | 257/82 |
| 6,686,610 B2 | * | 2/2004 | Sheu ............................ | 257/103 |
| 6,693,352 B1 | * | 2/2004 | Huang et al. ................ | 257/743 |
| 2002/0179918 A1 | * | 12/2002 | Sung et al. .................... | 257/99 |
| 2004/0075097 A1 | * | 4/2004 | Goetz et al. .................. | 257/79 |

* cited by examiner

Primary Examiner—Craig A. Thompson
Assistant Examiner—Jennifer M Dolan

(57) ABSTRACT

A GaN semiconductor stack layer is formed on top of a substrate for manufacturing a light emitting diode. The GaN semiconductor stack layer includes, from the bottom up, an N-type GaN contact layer, a light emitting stack layer and a P-type contact layer. The next step is to form a digital transparent layer on the P-type GaN contact layer, then use dry etching technique to etch downward through the digital transparent layer, the P-type GaN contact layer, the light emitting layer, the N-type GaN contact layer, and form an N-metal forming area within the N-type GaN contact layer. The next step is to form a first ohmic contact electrode on the P-type contact layer to serve as P-type ohmic contact, and a second ohmic contact electrode on the N-metal forming area to serve as N-type ohmic contact. Finally, a bump pad is formed on the first ohmic contact electrode and the second ohmic contact electrode, respectively.

11 Claims, 10 Drawing Sheets

STRUCTURE AND MANUFACTURING METHOD FOR GAN LIGHT EMITTING DIODES

FIELD OF THE INVENTION

This invention relates to a structure and a manufacturing method for light emitting diodes (LED), and more specially to a structure and a manufacturing method for ohmic contact of light emitting diodes made of GaN or other wide bandgap materials.

BACKGROUND OF THE INVENTION

As shown in FIG. 1, a conventional GaN light emitting diode has a structure comprising a substrate 1, a buffer layer 2 formed on top of the substrate 1, an N-type GaN layer 3 formed on top of the buffer layer 2, a light emitting stack layer formed on top of the N-type GaN layer 3, and a P-type GaN layer 5 formed on top of the light emitting stack layer 4. As shown in FIG. 2A, using the inductively coupled plasma-reactive ion etching (ICP-RIE) dry etching technique, the structure of FIG. 1 is etched downwards through the P-type GaN layer 5, light emitting stack layer 4, and a portion of the N-type GaN layer 3 to form an N-Metal forming area 6 of depth about 10,000Å. As shown in FIG. 2B, a transparent conductive layer (TCL) 7, which can be used as a P-type ohmic contact, is formed on top of P-type GaN layer 5. As shown in FIG. 2C, an N-Metal 8, which can be used as an N-type ohmic contact, is formed on N-Metal forming area 6. As shown in FIG. 2D, a bump pad 9 with a diameter about 100 um is formed on both TCL 7 and N-Metal 8. A conventional GaN LED can be manufactured by following the aforementioned steps.

In the aforementioned steps, TCL 7, N-Metal 8, and bump pad 9 are formed by electronic gun vapor-phase steam electroplate technique, or other similar techniques, such as heat-resist vapor-phase steam electroplate, or splash vapor-phase steam electroplate. The TCL 7 is made of Ni/Au of size about 50 Å/50 Å, or other materials, such as NiCr/Au, or Ni/Aube. The N-Metal 8 is made of Ti/Al of size about 150 Å/1500 Å, or other materials, such as Ti/Al/Ti/Au (150 Å/1500 Å/2000 Å/1000 Å), or Ti/Al/Ni/Au (150 Å/1500 Å/2000 Å/1000 Å). The bump pad 9 is made of Ti/Au (150 Å/20000 Å), or other materials, such as, Ti/Al/Ti/Au (150 Å/1500 Å/2000 Å/10000 Å), or Ti/Al/Pt/Au (150 Å/1500 Å/2000 Å/10000 Å).

However, the structure and its ohmic contact of the conventional GaN LED manufactured with the aforementioned method have a drawback. Because the material used for TCL 7, Ni/Au, has a low photo-penetrability, it is necessary to be very thin (about 50 Å) to have a photo-penetrability of 70%. However, at this thickness, the electrical conductivity decreases. Thus, it is difficult to improve the operating voltage (Vf) and the illumination (Iv) of the conventional GaN LED effectively. To solve the problem, a new structure needs to be devised.

SUMMARY OF THE INVENTION

The first goal of the present invention is to provide a structure and a manufacturing method of GaN Leds with a digital transparent layer.

The second goal of the present invention is to provide a method for reducing the resistance between the Indium Tin Oxide (ITO) layer and P-type GaN contact layer. With carrier penetration in the digital transparent layer, the resistance between the ITO layer and the P-type contact layer becomes an ohmic contact, and thus the resistance is reduced.

The third goal of the present invention is to provide a material, in which carrier penetration can take place.

The present invention employs a material of indium tin oxide, which has a superior photo-penetrability, to replace the Ni/Au in forming the transparent conductive layer 7. However, because of the lack of an ohmic contact between the ITO material and the P-type GaN material, it is necessary to add another layer of digital transparent layer 10, as shown in FIG. 4. The effect of the carrier penetration will make the two materials become an ohmic contact so that the resistance is reduced.

According to the aforementioned goals, the present invention provides a structure and a manufacturing, method for fabricating GaN LEDs with a digital transparent layer. First, a substrate is provided, and a GaN semiconductor stack is formed on top of the substrate. The GaN semiconductor stack includes, from the bottom up, an N-type GaN contact layer, a light-emitting stack layer and a P-type GaN contact layer. Then, a digital transparent layer is formed on top of the P-type contact layer. A dry etching is performed to etch through the digital transparent layer, the P-type contact layer, the light-emitting stack layer, and finally reach and stop at the N-type contact layer to form in N-metal forming area. Then, a first ohmic contact electrode is formed on the P-type contact layer for P-type ohmic contact, and a second ohmic contact electrode is formed on the N-metal forming area for N-type ohmic contact. Finally, a bump pad is formed on the first ohmic contact electrode and the second ohmic contact electrode, respectively.

The present invention will become more obvious from the following description when taken in connection with the accompanying drawings which show, for purposes of illustration only, a preferred embodiment in accordance with the present invention.

DETAILED DESCRIPTION OF THE INVENTION

The preferred embodiment of the present invention is described as below. However, some parts of the figures are not drawn in accordance with the physical proportion due to the illustrative purpose. The emphasis on some parts or components is to provide a more clear description of the invention to those who are skilled in this field.

Figure 1:
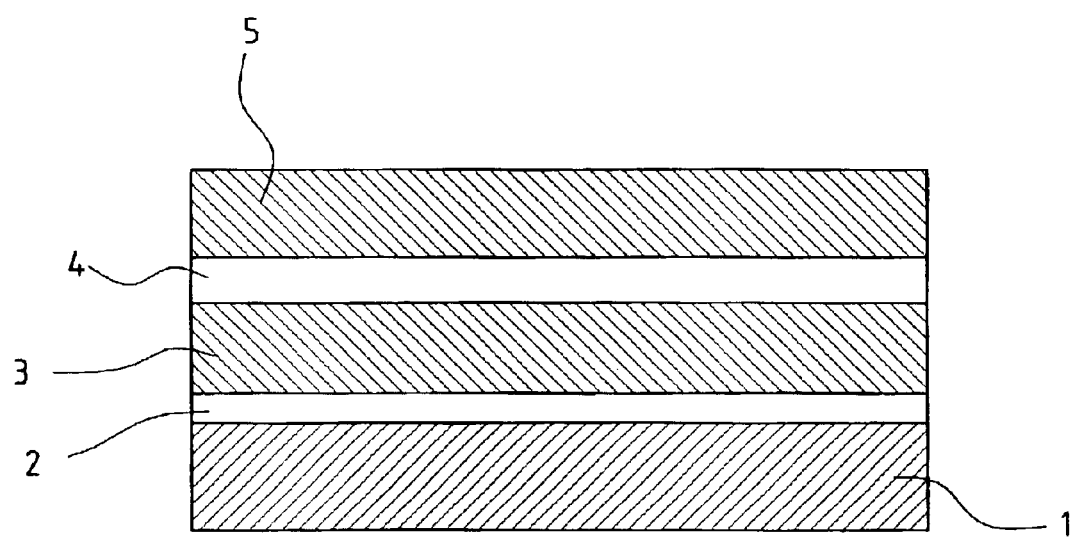
FIG. 1 shows a structure of a conventional GaN light emitting diode.
Figure 2A:
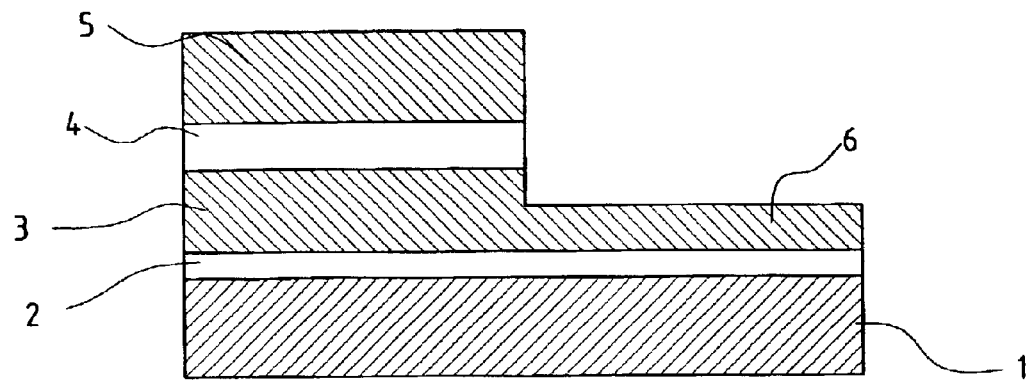
FIGS. 2A–D show the method for manufacturing the GaN LEDs according to the structure in FIG. 1.
Figure 2B:
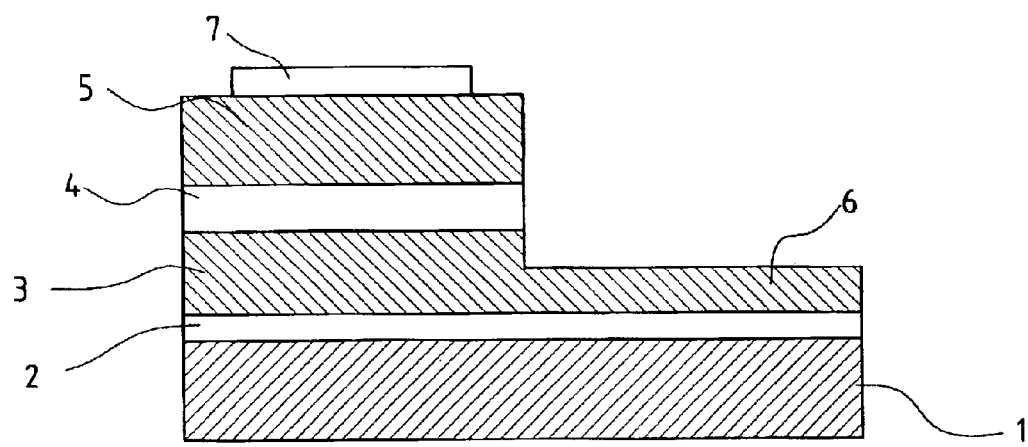
Figure 2C:
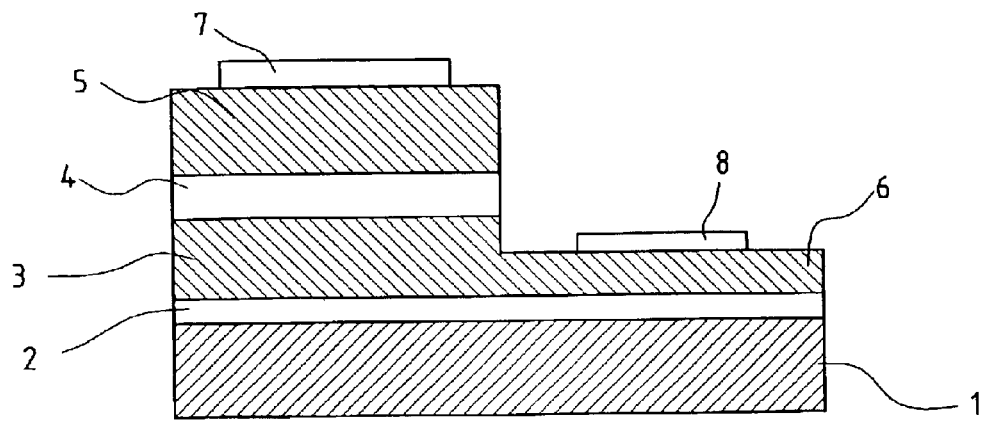
Figure 2D:
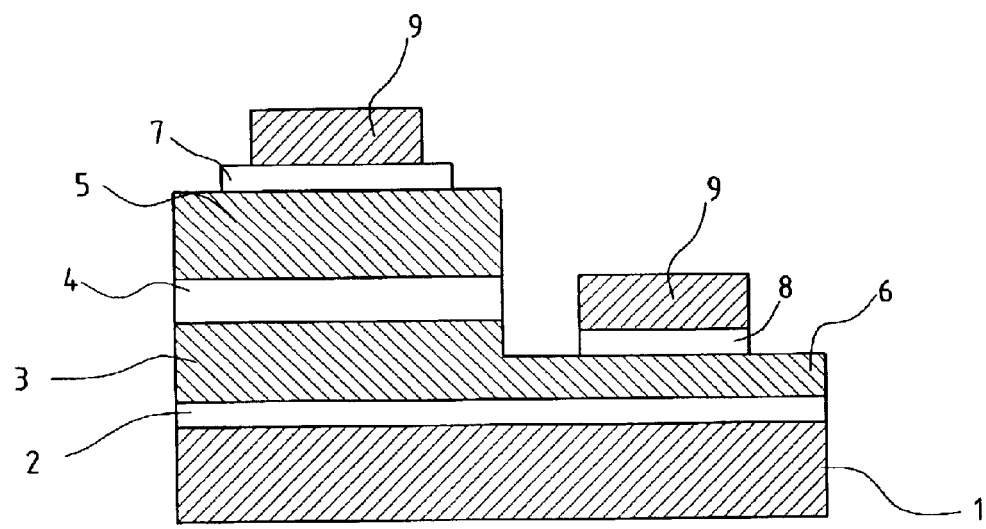
Figure 3:
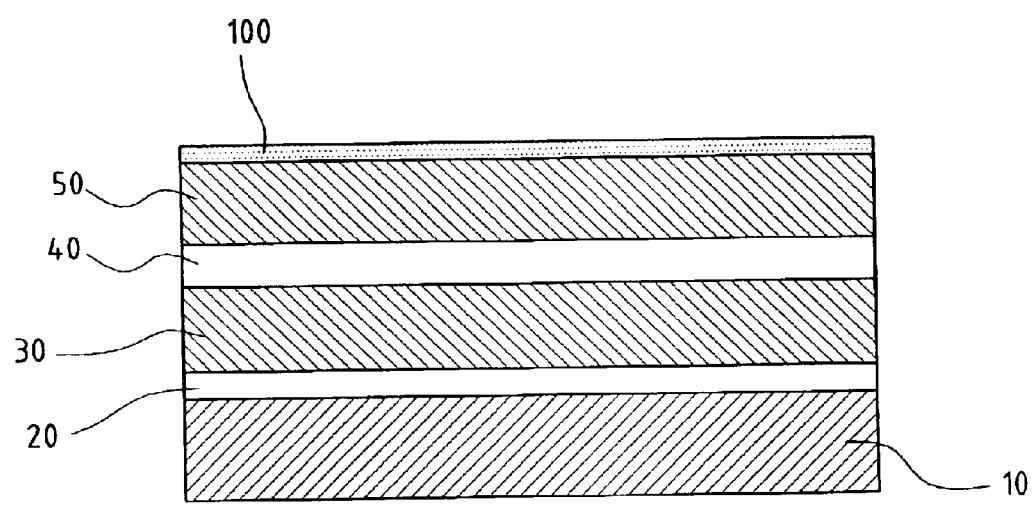
FIG. 3 shows the structure of the present invention.
Figure 4:
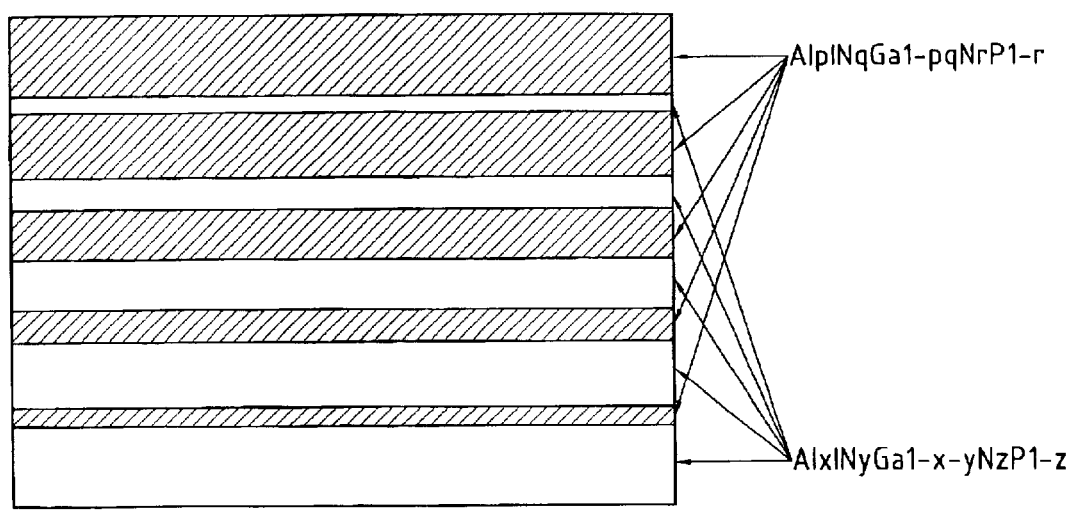
FIG. 4 shows a cross section diagram of the digital transparent layer.

As shown in FIG. 3, a substrate 10 is provided. A buffer layer 20 is formed on the substrate 10 by using metal organic chemical vapor deposition (MOCVD), molecular beam epitaxy, vapor phase epitaxy (VPE), or liquid phase epitaxy (LPE). The present invention prefers the MOCVD method. By using the same method, an N-type GaN layer 30 is formed on top of the buffer layer 20, a light-emitting stack layer 40 is formed on top of the N-type GaN layer 30, a P-type GaN layer 50 is formed on top of the light-emitting stack layer 40, and finally, a digital transparent layer 100 is formed on top of the P-type GaN layer 50. The cross section of the digital transparent layer 100 is shown in FIG. 4. As seen in FIG. 4, the digital transparent layer 100 is stacked by layers made of two types of material. The thickness of the layers in the stack made of one type of material increases from 10 Å to 90 Å, denoted as Al(x)In(y)Ga(1-x-y)N(z)P(1-z), and the other decreases from 90 Å to 10 Å, denoted as Al(p)In(q)Ga(1-p-q)N(r)P(1-r), where the values of x, y, z, p, q, r, are all between 0 and 1.

Figure 5A:
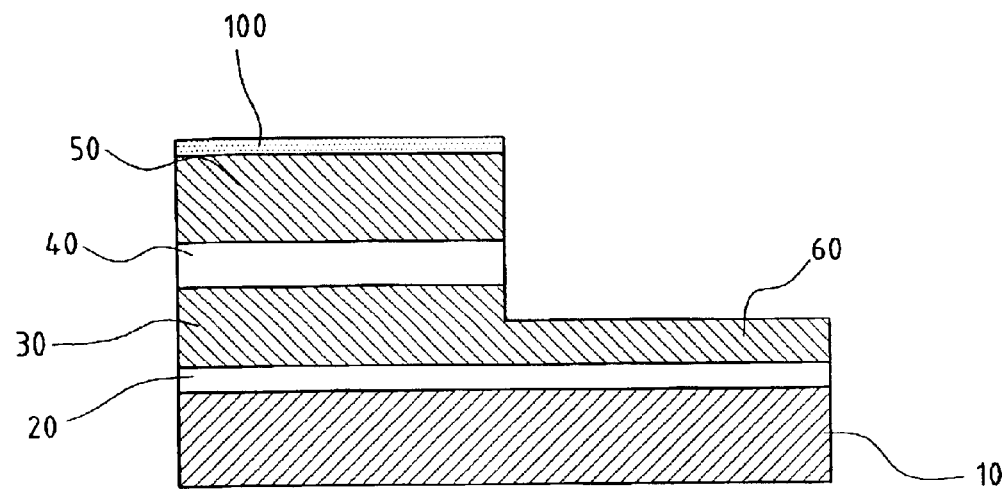
FIGS. 5A–D show the method for manufacturing the GaN LEDs according to the structure in FIG. 4.

The next step is to use a dry etching method to etch downward through the digital transparent layer 100, P-type GaN layer 50, light emitting stack layer 40, and finally reach and stop at the N-type layer 30. The etching will form an N-metal forming area of about 10000 Å. The preferred dry etching method used in the present invention is the inductively coupled plasma-reactive ion etching (ICP-RIE), as shown in FIG. 5A.

Figure 5B:
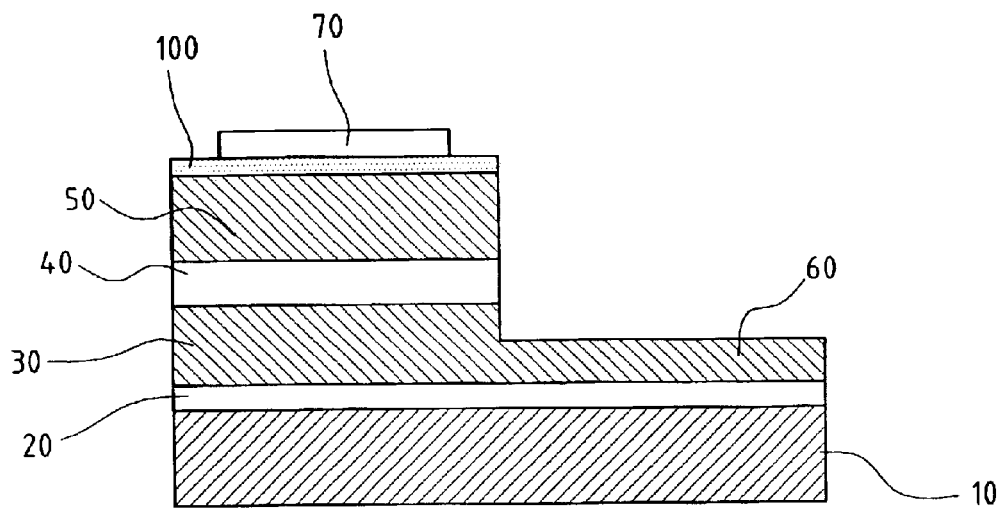

The next step is to use electronic gun vapor-phase steam electroplate technique, or other similar techniques, such as heat-resist vapor-phase steam electroplate, or splash vapor-phase steam electroplate technique to form an ITO layer 110 on top of the digital transparent layer 100. The ITO layer 110, which is transparent and can be used as a P-type ohmic contact, serves as a first ohmic contact electrode. The preferred method used in the present invention is the splash vapor-phase steam electroplate technique, and the preferred thickness of the ITO layer 110 is 1000 Å to 4000 Å, although it could range from 100 Å to 20000 Å, as shown in FIG. 5B.

Figure 5C:
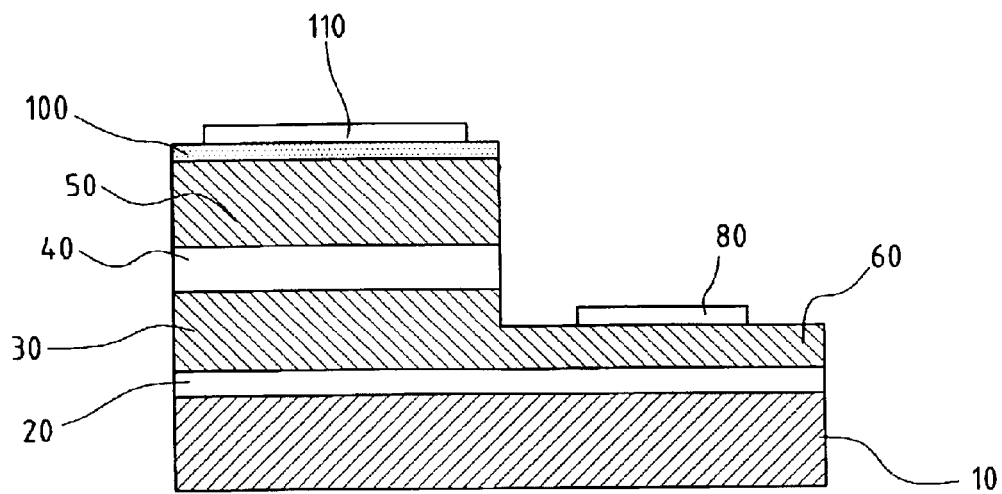

The next step is to form, by using the aforementioned techniques, an N-metal 80, which is used as an N-type ohmic contact, on top of the N-metal forming area 60. The N-type ohmic contact is used as a second ohmic contact electrode. The preferred technique used in the present invention is the electronic gun vapor-phase steam electroplate technique. The material used for N-metal 80 is Ti/Al of size about 150 Å/1500 Å, or other materials, such as Ti/Al/Ti/Au (150 Å/1500 Å/2000 Å/1000 Å), or Ti/Al/Ni/Au(150 Å/1500 Å/2000 Å/1000 Å), as shown in FIG. 5C.

Figure 5D:
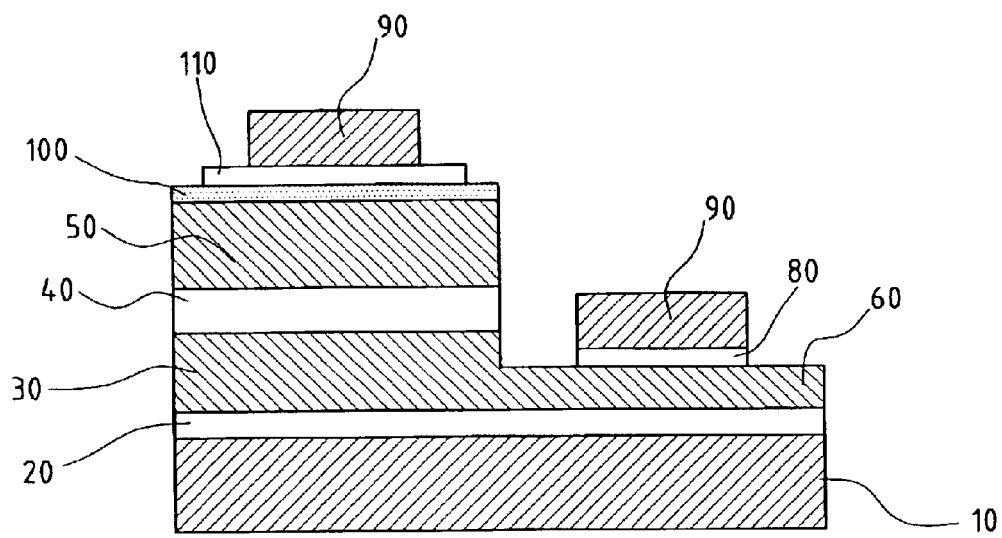

Finally, a bump pad 90 of diameter about 100 um each is formed on the ITO layer 110 and N-metal 80, respectively. The preferred technique used in the present invention is electronic gun vapor-phase steam electroplate technique. The bump pad 90 is made of Ti/Au (150 Å/20000 Å), or other materials, such as, Ti/Al/Ti/Au (150 Å/1500 Å/2000 Å/10000 Å), or Ti/Al/Pt/Au (150 Å/1500 Å/2000 Å/10000 Å), as shown in FIG. 5D. Hence, a GaN LED is manufactured in accordance with the methods described in the present invention.

Figure 6:
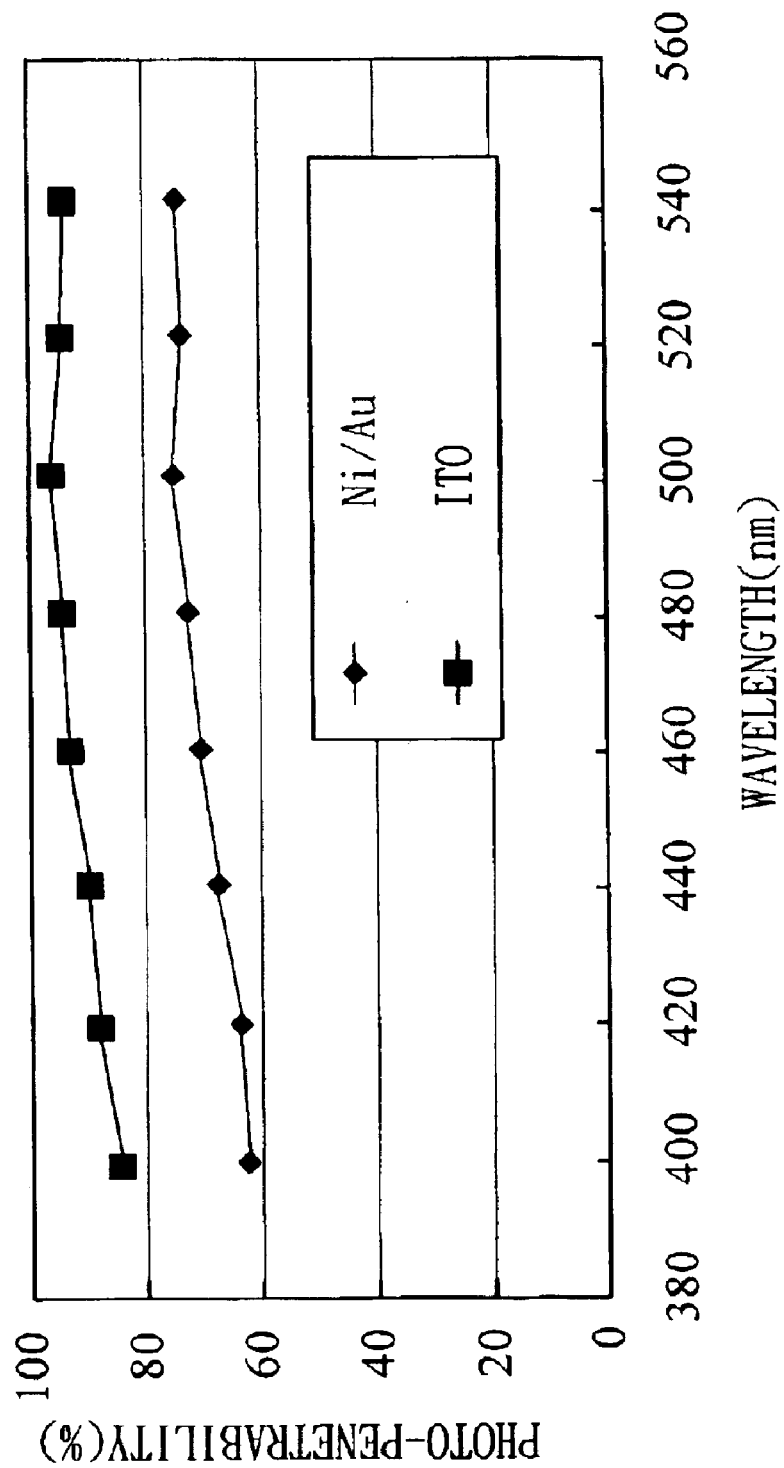
FIG. 6 shows the relationship between wavelength (in nm) and the thickness of the Ni/Au layer and the indium tin oxide layer.

FIG. 6 shows the relationship between wavelength (in nm) and the thickness of the Ni/Au layer and the indium tin oxide layer. As seen in the figure, photo-penetrability for the Ni/Au layer is 73% when the wavelength is 500 nm, while the value for ITO layer is 93% when the wavelength is 500 nm. Obviously, the photo-penetrability of the ITO layer is much better than that of the Ni/Au layer.

Figure 7:
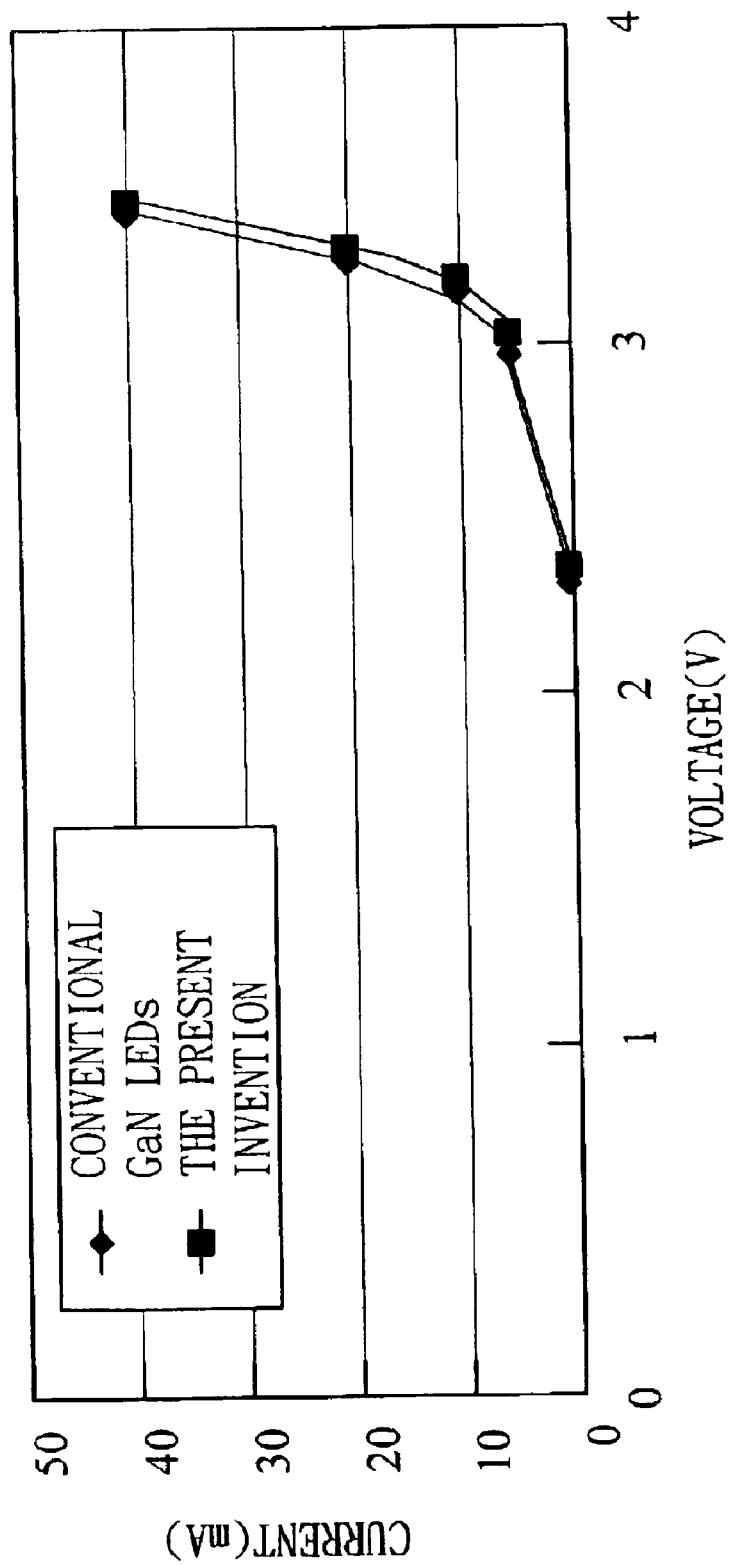
FIG. 7 shows the characteristic relationship between the current and the voltage for the conventional GaN LEDs, and the present invention.
Figure 8:
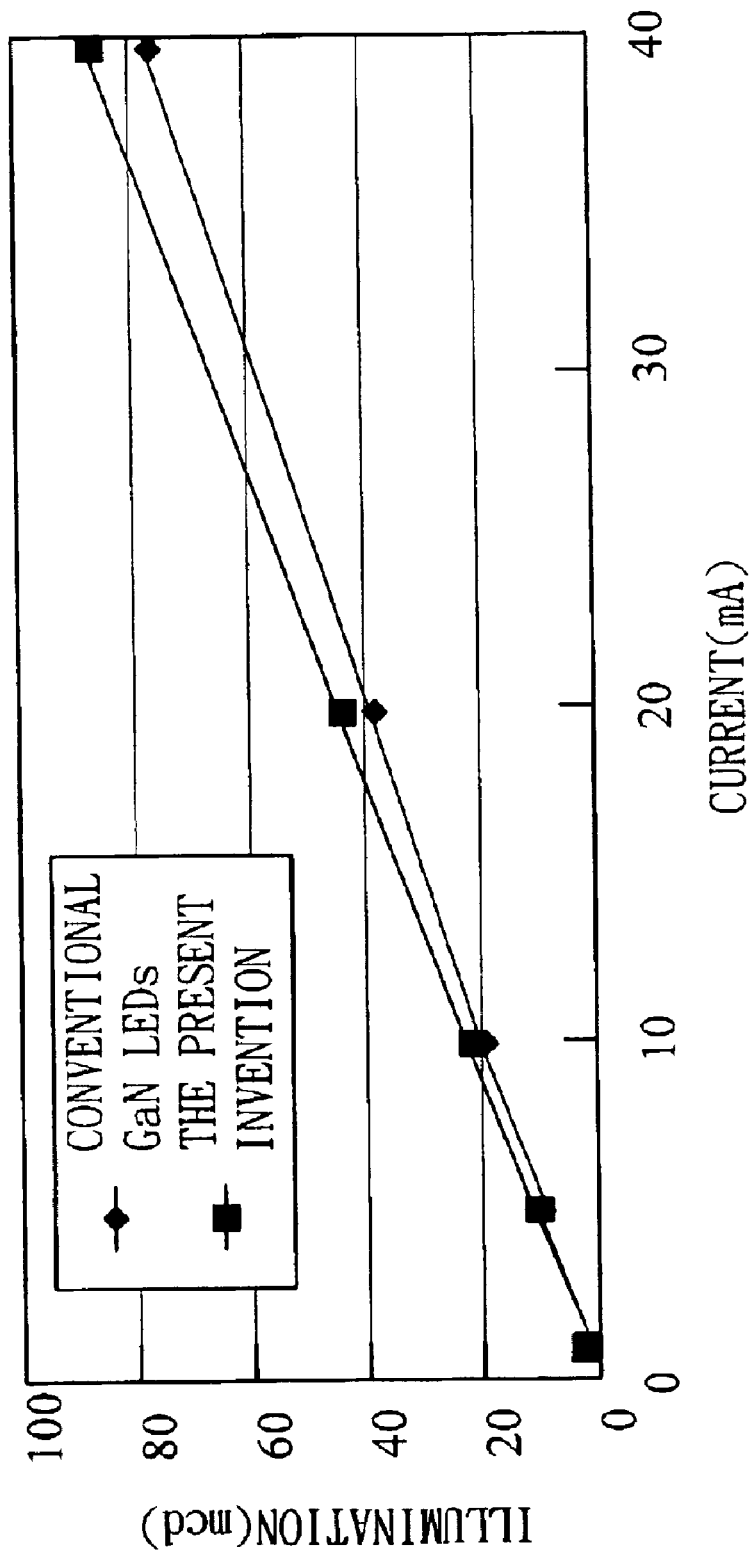
FIG. 8 shows the characteristic relationship between the illumination and the current for the conventional GaN LEDs, and the present invention.

FIG. 7 shows the charactcrisdc relationship between the current and the voltage for the conventional GaN LEDs, and the present invention. FIG. 8 shows the characteristic relationship between the illumination and the current for the conventional GaN LEDs, and the present invention. As seen from the figure, although the electrical characteristics are quite similar in both diodes the illumination of the diodes manufactured as the present invention increases about 20%. It proves that the present invention is a progress over the prior arts.

While we have shown and described the embodiment in accordance with the present invention, it should be clear to those skilled in the art that further embodiments may be made without departing from the scope of the present invention.

What is claimed is:

1. A GaN light emitting diode structure, comprising:
   a substrate;
   a GaN semiconductor stack layer formed on said substrate; said GaN semiconductor stack layer having a first upper surface and a second upper surface;
   a digital transparent layer formed on said first upper surface, said digital transparent layer having a stack of alternating Al(x)In(y)Ga(1-x-y)N(z)P(1-z) and Al(p)In(q)Ga(1-p-q)N(r)P(1-r) layers, wherein the values of x, y, z, p, q, r, are between 0 and 1;
   a first ohmic contact electrode formed on said digital transparent layer for P-type ohmic contact; and
   a second ohmic contact electrode formed on said second upper surface for N-type ohmic contact.

2. The GaN light emitting diode structure as claimed in claim 1, wherein said GaN semiconductor stack layer comprises an N-type GaN contact layer, a light emitting stack layer and a P-type GaN contact layer.

3. The GaN light emitting diode structure as claimed in claim 1, wherein the layers of Al(x)In(y)Ga(1-x-y)N(1-z) in said digital transparent layer have thickness increasing from 10 Å to 90 Å, and the layers of Al(p)In(q)Ga(1-p-q)N(r)P(1-r) have thickness decreasing from 90 Å to 10 Å.

4. The GaN light emitting diode structure as claimed in claim 1, wherein said first ohmic contact electrode is made of indium tin oxide.

5. The GaN light emitting diode structure as claimed in claim 4, wherein the thickness of said first ohmic contact ranges from 100 Å to 20000 Å.

6. The GaN light emitting diode structure as claimed in claim 1, wherein the distance between said substrate and said first ohmic contact electrode is greater than the distance between said substrate and said second ohmic contact electrode.

7. A GaN light emitting diode structure, comprising:
   a substrate;
   a buffer layer formed on top of said substrate;
   an N-type GaN contact layer formed on top of said buffer layer;
   a light-emitting stack layer formed on top of said N-type contact layer;
   a P-type GaN contact layer formed on top of said light emitting stack layer;
   a digital transparent layer formed on said P-type GaN contact layer, said digital transparent layer having a stack of alternating Al(x)In(y)Ga(1-x-y)N(z)P(1-z) and Al(p)In(q)Ga(1-p-q)N(r)P(1-r) layers, wherein the values of x, y, z, p, q, r, are between 0 and 1;
   a first ohmic contact electrode formed on said digital transparent layer for P-type ohmic contact; and a second ohmic contact electrode formed on said N-type GaN contact layer for N-type ohmic contact.

8. The GaN light emitting diode structure as claimed in claim 7, wherein the layers of $Al(x)In(y)Ga(1-x-y)N(z)P(1-z)$ in said digital transparent layer have thickness increasing from 10 Å to 90 Å, and the layers of $Al(p)In(q)Ga(1-p-q)N(r)P(1-r)$ have thickness decreasing from 90 Å to 10 Å.

9. The GaN light emitting diode structure as claimed in claim 7, wherein said first ohmic contact electrode is made of indium tin oxide.

10. The GaN light emitting diode structure as claimed in claim 9, wherein the thickness of said first ohmic contact ranges from 100 Å to 20000 Å.

11. The GaN light emitting diode structure as claimed in claim 7, wherein the distance between said substrate and said first ohmic contact electrode is greater than the distance between said substrate and said second ohmic contact electrode.

* * * * *